US006977836B2

(12) United States Patent
Gendrier et al.

(10) Patent No.: US 6,977,836 B2
(45) Date of Patent: Dec. 20, 2005

(54) MEMORY DEVICE THAT CAN BE IRREVERSIBLY PROGRAMMED ELECTRICALLY

(75) Inventors: Philippe Gendrier, Grenoble (FR); Daniel Caspar, Saint Hilaire du Tovet (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/449,921

(22) Filed: May 30, 2003

(65) Prior Publication Data

US 2004/0052148 A1 Mar. 18, 2004

(30) Foreign Application Priority Data

May 30, 2002 (FR) .................................. 02 06651

(51) Int. Cl.[7] .......................... G11C 17/04; G11C 17/14
(52) U.S. Cl. ...................... 365/149; 365/96; 365/102
(58) Field of Search ............................... 365/149, 102, 365/104, 96, 225.7

(56) References Cited

U.S. PATENT DOCUMENTS

| | | | |
|---|---|---|---|
| 4,499,557 A | * | 2/1985 | Holmberg et al. .......... 365/163 |
| 5,148,391 A | | 9/1992 | Zagar |
| 5,241,496 A | * | 8/1993 | Lowrey et al. ............... 365/96 |
| 5,724,282 A | | 3/1998 | Loughmiller et al. |
| 6,115,283 A | | 9/2000 | Hidaka |
| 6,310,797 B1 | * | 10/2001 | Muneno ....................... 365/145 |

FOREIGN PATENT DOCUMENTS

EP 0 528 417 A2 2/1993

OTHER PUBLICATIONS

Wee et al., "An antifuse EPROM circuitry scheme for field-programmable repair in DRAM" IEEE J. Solid-State Circuits, vol. 35, No. 10, Oct. 2000, pp. 1408-1414.*

* cited by examiner

*Primary Examiner*—Richard Elms
*Assistant Examiner*—J. H. Hur
(74) *Attorney, Agent, or Firm*—Lisa K. Jorgenson; Stephen Bongini; Fleit, Kain, Gibbons, Gutman, Bongini & Bianco P.L.

(57) ABSTRACT

A non-volatile memory device includes a memory plane formed from a matrix of memory cells, each including an access transistor and a capacitor. The matrix includes first and second groups of cells laid out in a first and second directions. Each first group includes cells whose transistor gates are connected together by a first metallization, whose upper capacitor electrodes are connected together by a second metallization, and whose transistor sources are not connected together. Each second group includes cells whose transistor sources are connected together by a third metallization, whose transistor gates are not connected together, and whose upper capacitor electrodes are not connected together. The device includes control means capable of applying chosen voltages to the first, second, and third metallizations so as to selectively program a single one of the cells by damaging its dielectric without programming the other cells and without damaging the transistors of the cells.

18 Claims, 2 Drawing Sheets

MEMORY DEVICE THAT CAN BE IRREVERSIBLY PROGRAMMED ELECTRICALLY

CROSS-REFERENCE TO RELATED APPLICATIONS

This application is based upon and claims priority from prior French Patent Application No. 02-06651, filed May 30, 2002, the entire disclosure of which is herein incorporated by reference.

BACKGROUND OF THE INVENTION

1. Field of the Invention

The present invention relates to semiconductor memory devices, and more specifically to non-volatile memories that can be irreversibly programmed electrically.

2. Description of Related Art

The present invention can advantageously, but non-limitingly, be applied to the "repair" of a dynamic random access memory (DRAM). Specifically, DRAM memories generally include a memory plane together with columns and rows of redundant memory cells which can be incorporated into the memory plane, so as to replace defective columns or rows, by using memory cells having a configuration of the type which can be irreversibly programmed electrically just once.

The article by Jae-Kyung et al. entitled "An Antifuse EPROM Circuitry Scheme for Field-Programmable Repair in DRAM" (IEEE Journal of Solid-State Circuits, Vol. 35, No. 10, October 2000) describes such an exemplary application. More specifically, in this article, individual blocks, each one having a cell which can be irreversibly programmed electrically and made up of a capacitor and an access transistor, are connected to redundant rows and columns of the memory plane.

As a consequence, such a structure has the drawback of requiring the production on silicon of several independent blocks, the number of which increases as the size of the DRAM memory increases.

SUMMARY OF THE INVENTION

In view of these drawbacks, it is an object of the present invention to overcome these drawbacks and to provide a matrix architecture for a non-volatile memory device which can be irreversibly programmed electrically.

In preferred embodiments, it is particularly advantageous to use, for each cell which can be irreversibly programmed electrically, a capacitor of the type used in the DRAM memory cells. Such a capacitor has a dielectric which is compatible with DRAM technology. Generally, such a capacitor is specified to operate at a voltage equal to Vdd/2, where Vdd denotes the nominal supply voltage which can be used in that DRAM technology. Thus, if 0.18 micron technology is used, the nominal voltage is equal to 1.8 volts. And, by operating at a voltage equal to Vdd/2, the capacitor is then provided in order to have a certain defect-free life. In contrast, if the voltage applied to these terminals is greater than Vdd/2, the dielectric of the capacitor is then subject to stresses which will reduce its life, this being all the more so the higher the voltage applied. And, if a very high voltage, for example of 7 volts in 0.18 micron technology, is applied to the terminals of the capacitor, the dielectric is then irreversibly damaged, and the capacitor then behaves like a low-impedance resistor.

Although using capacitors of the DRAM type in the memory device which can be irreversibly programmed has a definite advantage since this enables this memory device to be incorporated into DRAM memories without modifying the manufacturing process, this causes a particular difficulty for controlling such a memory device. Specifically, the irreversible programming by destroying the dielectric of a memory cell of the device must not damage the dielectrics of the capacitors of the other memory cells of the device. Similarly, this irreversible programming must not damage the access transistors of the cells of the device.

Another object of the present invention is to solve these problems and to allow the irreversible programming of the memory device by programming a single memory cell at a time, and to do this without damaging the dielectrics of the capacitors of the other memory cells, and without applying additional stresses which would reduce their lives.

Yet another object the present invention is to not adversely affect the properties of the access transistors of the memory cells.

One embodiment of the present invention provides a non-volatile memory device that can be irreversibly programmed electrically. The device includes a memory plane formed from a matrix of memory cells, with each of the memory cells including an access transistor and a capacitor. The memory cell matrix includes first groups of memory cells laid out in a first direction and second groups of memory cells laid out in a second direction. Each first group includes memory cells whose transistor gates are connected together by a first metallization, whose upper capacitor electrodes are connected together by a second metallization, and whose transistor sources are not connected together. Each second group includes memory cells whose transistor sources are connected together by a third metallization, whose transistor gates are not connected together, and whose upper capacitor electrodes are not connected together. The device also includes control means capable of applying chosen voltages to the first, second, and third metallizations so as to selectively program a single one of the memory cells by damaging its dielectric without programming the other memory cells and without damaging the transistors of the memory cells. In a preferred embodiment, the dielectric of the capacitor of each of the memory cells is compatible with technology of the random access memory type.

Another embodiment of the present invention provides an integrated circuit that includes at least one such non-volatile memory portion that can be irreversibly programmed electrically.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
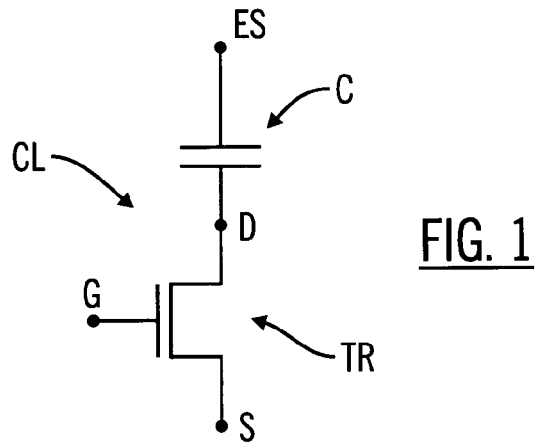
FIG. 1 illustrates a memory cell according to a preferred embodiment of the present invention.

Preferred embodiments of the present invention will be described in detail hereinbelow with reference to the attached drawings.

Preferred embodiments of the present invention provide non-volatile memory devices that can be irreversibly programmed electrically. The memory device includes a memory plane formed from a matrix of memory cells, with each one of the cells formed from an access transistor and a capacitor whose dielectric is compatible with technology of the "random access memory" type. The cell matrix includes first cell groups laid out in a first direction, for example in order to form the rows of the matrix. Each first group has cells whose transistor gates are connected together by a first metallization, and whose upper capacitor electrodes (i.e., the electrode which is not connected to the drain of the access transistor) are connected together by a second metallization. The transistor sources of these cells are not connected together.

The cell matrix also includes second cell groups laid out in a second direction, for example in order to form the columns of the matrix. Each second group includes cells whose transistor sources are connected together by a third metallization, whose transistor gates are not connected together, and whose upper capacitor electrodes are not connected together. The device also includes control means capable of applying chosen voltages to the first, second, and third metallizations so as to selectively program a single cell by damaging its dielectric without programming the other cells and without damaging the transistors of all of the cells.

Thus, in preferred embodiments of the present invention, it is the combination of the specific matrix architecture of the device and the chosen voltages applied by the control means which makes it possible to program only a single cell at one time without impairing or damaging the components of the other cells or the transistor of the programmed cell.

According to one embodiment of the present invention, the control means is capable of programming the cell in question by applying to the corresponding first metallization a gate voltage for switching on the transistor of the cell, and by applying to the corresponding second and third metallizations enough voltage difference to damage the dielectric of the capacitor of the cell. As is known, the value of this voltage difference is chosen according to the technology used. By way of example, it is possible to apply a voltage difference of about four times Vdd, where Vdd denotes the supply voltage which can be used in the DRAM technology. The gate voltage and the voltage difference are also chosen so as not to adversely affect the properties of the transistor. The control means is also capable of applying to the first, second, and third metallizations different from those which are connected to the cell in question, voltages for switching off the transistors of the other cells of the memory plane.

It is particularly advantageous for the control means to be capable of applying the same voltages to the second and third metallizations which are different from those which are connected to the cell in question. This makes it possible to apply the same voltages to the two extreme terminals of cells which are neither in the same row nor in the same column as the cell in question, and consequently to avoid any flow of current through the capacitors of these cells due to leakage of the transistors in their off states.

According to one embodiment of the present invention in which the transistors of the cells are nMOS transistors, the control means is capable of programming the cell in question by applying to the corresponding first metallization a gate voltage greater than the threshold voltage of the transistor of the cell, by connecting the corresponding third metallization to ground and by applying to the corresponding second metallization a programming voltage which is enough to damage the dielectric of the capacitor. Here again, it is know how to choose such a programming voltage according to the technology used, such as, for example, a programming voltage equal to about four times the voltage Vdd. Moreover, the control means is capable of connecting to ground the first metallizations which are different from that which is connected to the cell in question, and of applying the gate voltage to the second and third metallizations which are different from those which are connected to the cell in question.

Preferably, the control means is capable of applying chosen voltages to the first, second, and third metallizations so that the logic content of a single cell can be selectively read without reading the contents of the other cells. For example, according to one embodiment of the present invention, the control means is capable of reading the contents of the cell in question by applying to the corresponding first metallization a gate voltage for switching on the transistor of the cell, and by applying to the corresponding second and third metallizations a voltage difference less than Vdd/2. Moreover, the control means is capable of applying to the first, second, and third metallizations which are different from those which are connected to the cell in question, voltages for switching off the transistors of the other cells of the memory plane.

So as to minimize the effect of potential transistor leakage, it is particularly advantageous for the control means to be capable of applying the same voltages to the second metallizations and to the third metallizations which are different from the one which is connected to the cell in question.

According to one exemplary embodiment of the present invention in which the transistors of the cells are nMOS transistors, the control means is capable of reading the logic contents of the cell in question by applying a read voltage to the corresponding second metallization, by applying to the corresponding third metallization a source voltage such that the difference between the read voltage and the source voltage is less than Vdd/2 but greater than the threshold voltage of the transistor, and by applying to the corresponding first metallization a gate voltage equal to the read voltage. Moreover, the control means is capable of connecting to ground the first metallizations which are different from the one which is connected to the cell in question, and of applying the read voltage to the second and third metallizations which are different from those which are connected to the cell in question.

Exemplary embodiments of the present invention will now be described in detail with reference to FIGS. 1–3.

FIG. 1 shows a memory cell according to a preferred embodiment of the present invention. As shown, the memory cell CL includes an access transistor TR, for example an nMOS transistor, and a capacitor C connected to the drain of this transistor. The capacitor may, for example, be made by means of another MOS transistor. The capacitor C is similar to those used in the memory cells of DRAM memories. The memory cell CL has three terminals: the source S of the access transistor, the gate G of this transistor, and the upper electrode ES of the capacitor (which is the electrode away from the one which is common to the drain of the access transistor).

The operation of such a memory cell lies in the possibility of altering the impedance of the S-ES circuit by "breakdown" of the capacitor. Thus it is possible, for example, to consider that when the capacitor has not broken down, it has a highly capacitive impedance and that the memory cell is programmed, for example to a logic value 0. On the other hand, when the capacitor C is broken down (i.e., when its dielectric has been damaged), the impedance of the S-ES circuit becomes essentially resistive and the memory cell is then programmed, for example with a logic content equal to 1.

The content of such a memory cell is conventionally read by applying a voltage difference between the terminals ES and S and by measuring the current flowing in this path. If the current is very low, the capacitor has not broken down. On the other hand, if the current is high, this means that the impedance of the path is essentially resistive and that consequently the capacitor has broken down.

The principle of capacitor breakdown consists in creating a high enough potential difference between the terminals ES and S and applying a voltage to the gate G of the transistor, so as to switch it on. This high voltage difference has the effect of damaging the dielectric of the capacitor so as to create a low impedance path between these two terminals. By way of example, for 0.18 micron technology in which the nominal operating voltage Vdd is 1.8 volts, applying a potential difference of about 7 volts to the terminals of the capacitor is enough to damage it. Moreover, in 0.18 micron technology, the capacitor C is made so as to have a predetermined life when the voltage at these terminals does not exceed Vdd/2. On the other hand, if the voltage at these terminals exceeds Vdd/2, the life of the capacitor decreases and this occurs all the quicker the higher the voltage applied to these terminals.

Figure 2:
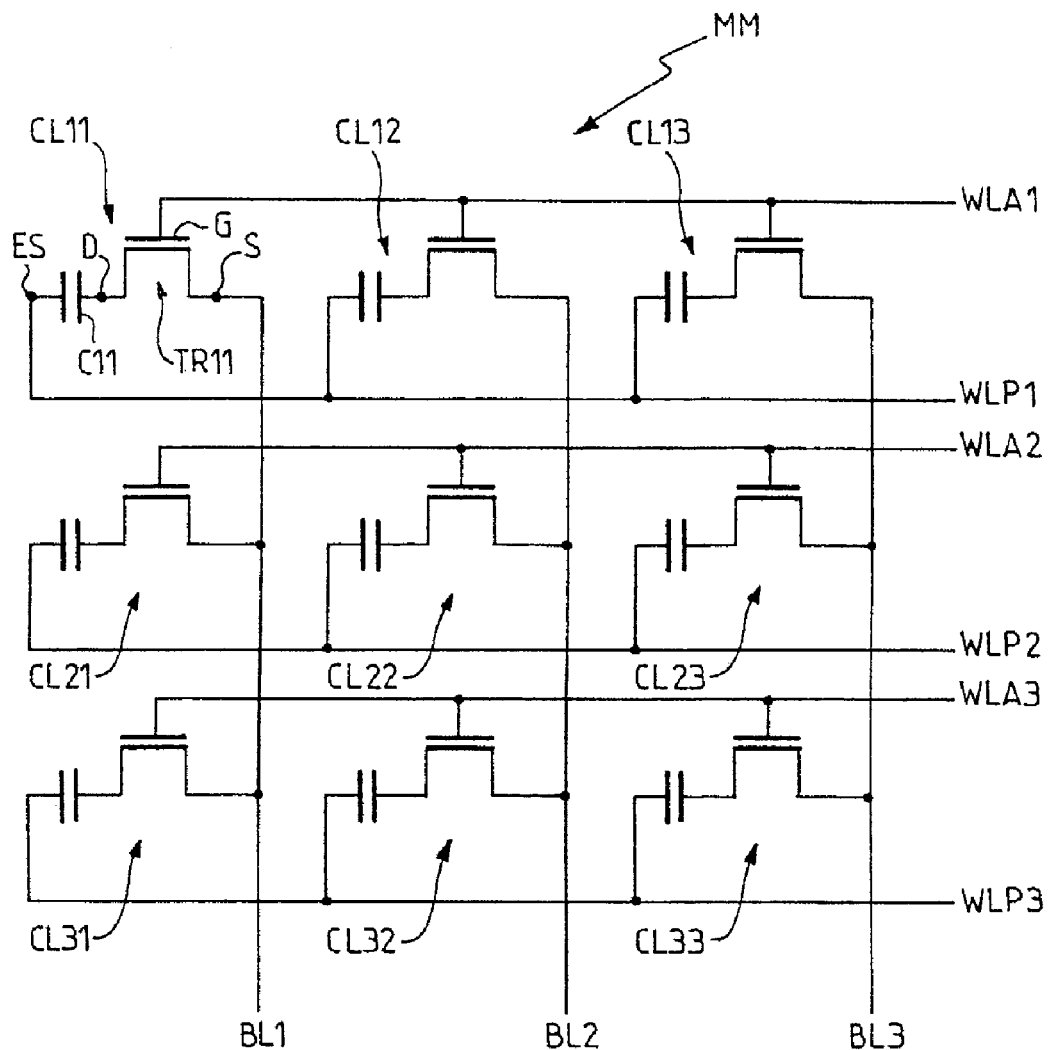
FIG. 2 illustrates a memory device according to one embodiment of the present invention.

The memory cells CL are arranged in matrix form as illustrated in FIG. 2, so as to form the memory plane of a memory device MM according to the present invention, which is preferably made in the form of an integrated circuit. The matrix of the memory plane is organized in rows and columns.

As shown in FIG. 2, each row has a first group of memory cells. The first row is formed by the first group consisting of cells CL11, CL12, and CL13. The second row is formed from the first group consisting of cells CL21, CL22, and CL23, while the third row consists of the first group formed by cells CL31, CL32, and CL33.

Each first group includes cells whose transistor gates are connected together by a first metallization WLAi (i=1 for the first row, i=2 for the second row, and i=3 for the third row). Moreover, the upper electrodes ES of the capacitors of these cells are connected together by a second metallization WLPi (i=1 for the first row, i=2 for the second row, and i=3 for the third row). Finally, the sources of the transistors of these cells are not connected together.

Moreover, each of the columns of the matrix is formed by a second group of memory cells. The first column is formed by the second group consisting of cells CL11, CL21, and CL31. The second column is formed by the second group consisting of cells CL12, CL22, and CL32, and the third column is formed by the second group consisting of cells CL13, CL23, and CL33. The cells of each second group have transistors whose sources are connected together by a third metallization BLj (j=1 for the first column, j=2 for the second column, and j=3 for the third column). Moreover, the transistor gates of these cells are not connected together, and likewise the upper electrodes of the capacitors of these cells are not connected together.

The memory device also includes control means MCM which is capable, according to programming mode or read mode, of applying to the various metallizations WLAi, WLPi and BLj, chosen voltages so as to program a single cell without programming the other cells, or else to read a single cell without reading the other cells. Of course, if several cells of the memory device have to be programmed, their programming is carried out sequentially. The control means MCM is formed using well known voltage sources and logic circuits, and is designed in a known manner for a specific implementation.

Figure 3:
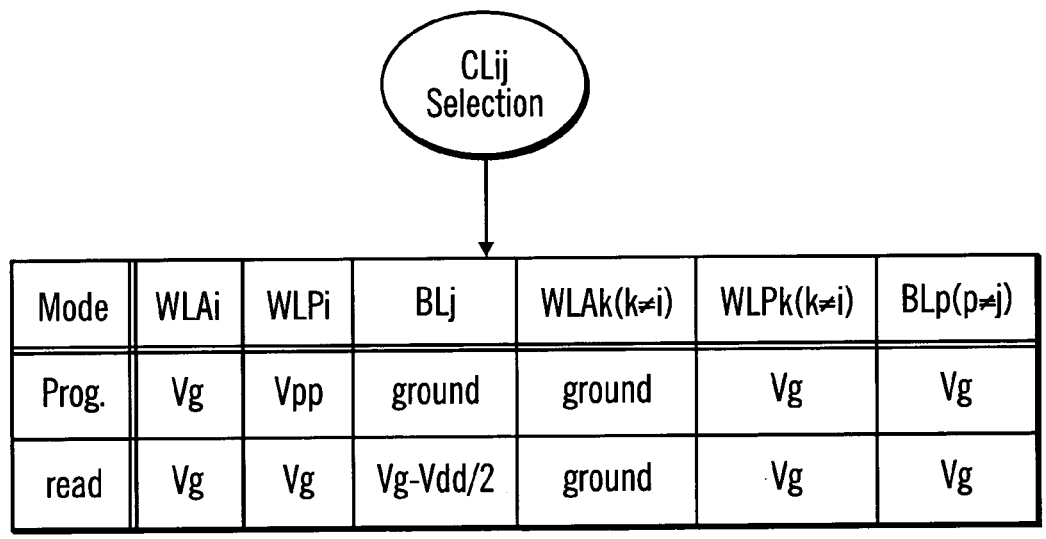
FIG. 3 illustrates one exemplary implementation of a programming and read mode for the memory device of FIG. 2.

With reference to FIG. 2 and FIG. 3, there will now be described the operation of the device according to the present invention in programming and read modes. It is assumed here that the cell to be programmed is the cell CLij, for example the cell CL11. It is also assumed that 0.18 micron technology is used. In such technology, two supply voltages are typically available: a nominal voltage Vdd equals 1.8 volts which is used for powering DRAM memories and the logic parts of the circuits, and a higher supply voltage Vdd1, for example 3.3 volts.

In this assumed situation, the control means applies to the first metallization WLAi a gate voltage Vg, for example equal to the supply voltage Vdd1. Moreover, the control means applies to the second metallization WLPi a programming voltage Vpp, equal for example to 6.9 volts. The third metallization BLj is connected to ground. As a result, the transistor TRij (in this case the transistor TR11) is on and a voltage difference of 6.9 volts is applied between the two electrodes of the capacitor Cij (in this case the capacitor C11). The dielectric of this transistor is consequently damaged and the cell is programmed to a logic value of 1.

Moreover, the control means applies to the third metallizations BLp, where p is different from j (in this case, the metallizations BL2 and BL3), the gate voltage Vg (in this case 3.3 volts). Consequently, the transistors of cells CL12 and CL13 see a zero gate/source voltage difference VGS. These transistors are consequently off. Thus, although a voltage of 7 volts is applied to the upper electrode of the capacitors of these two cells CL12 and CL13, the dielectric of these capacitors is not damaged since the transistors of the cells are off.

Moreover, the control means connects to ground the first metallizations WLAk, where k is different from i (in this case the first metallizations WLA2 and WLA3). Consequently, the transistors of the cells of the second and third rows are also off. This therefore results in no damage to the dielectric of the capacitors of these cells, whatever the voltages applied to the metallizations WLP2 and WLP3.

This being so, in practice, the transistors of these cells have leakage currents in their off state. Consequently, if a non-zero voltage difference exists between the upper terminal ES of the capacitor and the source of the corresponding transistor, stresses may be applied to the dielectric of the corresponding capacitor. While not destroying it, this stress will decrease its life. It is for this reason that the voltage Vg is also preferably applied to the metallizations WLP2 and WLP3. As a result, all of the memory cells which are not in the same row and in the same columns as the cell in question, and which represent the largest number of cells, will see a zero potential difference between their terminals ES and S.

Moreover, the transistors of the cells are specified for operating at Vdd1 without damage. And in this programming phase, given the voltages applied and the specific matrix architecture of the memory plane, the gate/source voltage of all the access transistors remains less than the voltage Vdd1 to within 10%, which does not adversely affect the properties of these transistors.

To read the cell CLij in question, the control means applies the gate voltage Vg to the first metallization WLAi and also to the second metallization WLPi. Moreover, a voltage Vs, such as Vg–Vs, that is less than or equal to Vdd/2, is applied to the third metallization BLj (in this case BL1). By way of example, the voltage Vs is taken to be equal to 0.9 volt. As a result, the transistor TR11 of the cell in question is on, since its gate/source voltage difference is greater than its threshold voltage. Furthermore, the voltage difference applied between the terminals ES and S of the cell CL11 is less than Vdd/2, which causes no stress in the dielectric of the capacitor.

With regard to the other metallizations, the gate voltage Vg is applied to the second metallizations WLP2 and WLP3 and the first metallizations WLA2 and WLA3 are connected to ground. As a result, the transistors of the cells, other than the cell CL11 in question, are off. Here again, in order to take account of any leakage of the transistors, applying the same voltage Vg to the second and third metallizations WLP and BLp where p is different from j, is preferred as it guarantees a zero potential difference between the two terminals ES and S of the cells in question.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A non-volatile memory device that can be irreversibly programmed electrically, said device comprising:
    a memory plane formed from a matrix of memory cells, each of the memory cells including an access transistor and a capacitor having a dielectric, the memory cell matrix including:
        first groups of memory cells laid out in a first direction, each first group including memory cells whose transistor gates are connected together by a first metallization, whose upper capacitor electrodes are connected together by a second metallization, and whose transistor sources are not connected together; and
        second groups of memory cells laid out in a second direction, each second group including memory cells whose transistor sources are connected together by a third metallization, whose transistor gates are not connected together, and whose upper capacitor electrodes are not connected together; and
    control means capable of applying chosen voltages to the first, second, and third metallizations so as to selectively program a single one of the memory cells by damaging its dielectric without programming the other memory cells and without damaging the transistors of the memory cells,
    wherein the control means is also capable of applying chosen second voltages to the first, second, and third metallizations so as to selectively read logic content of the one memory cell without reading logic content of the other memory cells, and
    the control means applies to the first, second, and third metallizations other than those which are connected to the one memory cell, voltages for switching off the transistors of the memory cells of the memory plane other than the one memory cell.

2. The device according to claim 1, wherein the dielectric of the capacitor of each of the memory cells of the memory cell matrix is compatible with technology of the random access memory type.

3. The device according to claim 1, wherein the control means programs the one memory cell by applying to the corresponding first metallization a gate voltage for switching on the transistor of the one memory cell, and by applying to the corresponding second and third metallizations a voltage difference that is sufficient to damage the dielectric of the capacitor of the one memory cell.

4. The device according to claim 3, wherein the gate voltage and the voltage difference are chosen so as not to adversely affect properties of the transistor of the one memory cell.

5. The device according to claim 4, wherein the control means applies the same voltage to the second and third metallizations other than those which are connected to the one memory cell.

6. The device according to claim 5,
    wherein the transistors of the memory cells are nMOS transistors, and
    the control means programs the one memory cell by applying to the corresponding first metallization a gate voltage greater than the threshold voltage of the transistor of the memory cell, by connecting the corresponding third metallization to ground, and by applying to the corresponding second metallization a programming voltage which is sufficient to damage the dielectric of the capacitor of the one memory cell.

7. The device according to claim 6, wherein the control means connects to ground the first metallizations other than those which are connected to the one memory cell, and applies the gate voltage to the second and third metallizations other than those which are connected to the one memory cell.

8. The device according to claim 1, wherein the control means reads the logic content of the one memory cell by applying to the corresponding first metallization a gate voltage for switching on the transistor of the one memory cell, and by applying to the corresponding second and third metallizations a second voltage difference that is less than Vdd/2, where Vdd is the supply voltage.

9. The device according to claim 1, wherein the control means applies the same voltages to the second metallizations and the third metallizations other than those which are connected to the one memory cell.

10. The device according to claim 9,
    wherein the transistors of the memory cells are nMOS transistors, and
    the control means reads the logic content of the one memory cell by applying a read voltage to the corresponding second metallization, by applying to the corresponding third metallization a source voltage such that a difference between the read voltage and the source voltage is less than Vdd/2 and greater than the threshold voltage of the transistor, and by applying to the corresponding first metallization a gate voltage equal to the read voltage.

11. The device according to claim 10, wherein the control means connects to ground the first metallizations other than those which are connected to the one memory cell, and applies the read voltage to the second and third metallizations other than those which are connected to the one memory cell.

12. An integrated circuit including at least one non-volatile memory portion that can be irreversibly programmed electrically, said non-volatile memory portion comprising:

a memory plane formed from a matrix of memory cells, each of the memory cells including an access transistor and a capacitor having a dielectric, the memory cell matrix including:

first groups of memory cells laid out in a first direction, each first group including memory cells whose transistor gates are connected together by a first metallization, whose upper capacitor electrodes are connected together by a second metallization, and whose transistor sources are not connected together; and second groups of memory cells laid out in a second direction, each second group including memory cells whose transistor sources are connected together by a third metallization, whose transistor gates are not connected together, and whose upper capacitor electrodes are not connected together; and control means capable of applying chosen voltages to the first, second, and third metallizations so as to selectively program a single one of the memory cells by damaging its dielectric without programming the other memory cells and without damaging the transistors of the memory cells, wherein the control means of the non-volatile memory portion is also capable of applying chosen second voltages to the first, second, and third metallizations so as to selectively read logic content of the one memory cell without reading logic content of the other memory cells, and the control means of the non-volatile memory portion applies to the first, second, and third metallizations other than those which are connected to the one memory cell, voltages for switching off the transistors of the memory cells of the memory plane other than the one memory cell.

13. The integrated circuit according to claim 12, wherein the dielectric of the capacitor of each of the memory cells of the memory cell matrix of the non-volatile memory portion is compatible with technology of the random access memory type.

14. The integrated circuit according to claim 12, wherein the control means of the non-volatile memory portion programs the one memory cell by applying to the corresponding first metallization a gate voltage for switching on the transistor of the one memory cell, and by applying to the corresponding second and third metallizations a voltage difference that is sufficient to damage the dielectric of the capacitor of the one memory cell.

15. The integrated circuit according to claim 14, wherein the gate voltage and the voltage difference are chosen so as not to adversely affect properties of the transistor of the one memory cell.

16. The integrated circuit according to claim 15, wherein the control means of the non-volatile memory portion applies the same voltage to the second and third metallizations other than those which are connected to the one memory cell.

17. The integrated circuit according to claim 12, wherein the control means of the non-volatile memory portion reads the logic content of the one memory cell by applying to the corresponding first metallization a gate voltage for switching on the transistor of the one memory cell, and by applying to the corresponding second and third metallizations a second voltage difference that is less than Vdd/2, where Vdd is the supply voltage.

18. The integrated circuit according to claim 12, wherein the control means of the non-volatile memory portion applies the same voltages to the second metallizations and the third metallizations other than those which are connected to the one memory cell.

* * * * *